United States Patent
Baars et al.

(10) Patent No.: US 8,846,513 B2
(45) Date of Patent: Sep. 30, 2014

(54) SEMICONDUCTOR DEVICE COMPRISING REPLACEMENT GATE ELECTRODE STRUCTURES AND SELF-ALIGNED CONTACT ELEMENTS FORMED BY A LATE CONTACT FILL

(75) Inventors: Peter Baars, Dresden (DE); Richard Carter, Dresden (DE); Rolf Stephan, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 118 days.

(21) Appl. No.: 13/241,915

(22) Filed: Sep. 23, 2011

(65) Prior Publication Data

US 2013/0075821 A1   Mar. 28, 2013

(51) Int. Cl.
- *H01L 21/3205* (2006.01)
- *H01L 21/768* (2006.01)
- *H01L 29/66* (2006.01)
- *H01L 21/285* (2006.01)
- *H01L 29/78* (2006.01)

(52) U.S. Cl.
CPC ..... *H01L 21/76897* (2013.01); *H01L 21/28518* (2013.01); *H01L 29/7848* (2013.01); *H01L 29/66545* (2013.01); *H01L 21/76814* (2013.01)
USPC ..... 438/586; 438/585; 438/595; 257/E21.409

(58) Field of Classification Search
CPC .......................... H01L 21/336; H01L 27/088
USPC ........... 438/585, 586, 595, 592; 257/E21.409
See application file for complete search history.

(56) References Cited

U.S. PATENT DOCUMENTS

| | | | |
|---|---|---|---|
| 6,072,221 A | 6/2000 | Hieda | |
| 6,939,751 B2 * | 9/2005 | Zhu et al. | 438/151 |
| 7,381,608 B2 * | 6/2008 | Brask et al. | 438/216 |
| 8,481,415 B2 * | 7/2013 | Yuan et al. | 438/585 |
| 2004/0115890 A1 | 6/2004 | Saito | |
| 2005/0266694 A1 | 12/2005 | Brask et al. | |
| 2011/0068411 A1 | 3/2011 | Sun et al. | |
| 2012/0164824 A1 * | 6/2012 | Jiang et al. | 438/595 |

OTHER PUBLICATIONS

Translation of Official Communication from German Patent Application No. 10 2011 090 163.9 dated Jul. 25, 2012.

* cited by examiner

*Primary Examiner* — Jose R Diaz
(74) *Attorney, Agent, or Firm* — Amerson Law Firm, PLLC

(57) ABSTRACT

When forming self-aligned contact elements in sophisticated semiconductor devices in which high-k metal gate electrode structures are to be provided on the basis of a replacement gate approach, the self-aligned contact openings are filled with an appropriate fill material, such as polysilicon, while the gate electrode structures are provided on the basis of a placeholder material that can be removed with high selectivity with respect to the sacrificial fill material. In this manner, the high-k metal gate electrode structures may be completed prior to actually filling the contact openings with an appropriate contact material after the removal of the sacrificial fill material. In one illustrative embodiment, the placeholder material of the gate electrode structures is provided in the form of a silicon/germanium material.

22 Claims, 12 Drawing Sheets

SEMICONDUCTOR DEVICE COMPRISING REPLACEMENT GATE ELECTRODE STRUCTURES AND SELF-ALIGNED CONTACT ELEMENTS FORMED BY A LATE CONTACT FILL

BACKGROUND OF THE INVENTION

1. Field of the Invention

The present disclosure generally relates to the fabrication of integrated circuits, and, more particularly, to the contact level of a semiconductor device, in which contact areas, such as drain and source regions, as well as gate electrode structures, are connected to the metallization system of the semiconductor device.

2. Description of the Related Art

In modern integrated circuits, such as microprocessors, storage devices and the like, a very high number of circuit elements, especially transistors, are provided and operated on a restricted chip area. Although immense progress has been made over recent decades with respect to increased performance and reduced feature sizes of the circuit elements, the ongoing demand for enhanced functionality of electronic devices forces semiconductor manufacturers to steadily reduce the dimensions of the circuit elements and to increase the operating speed thereof. The continuing scaling of feature sizes, however, involves great efforts in redesigning process techniques and developing new process strategies and tools so as to comply with new design rules. Generally, in complex circuitry including complex logic portions, MOS technology is presently a preferred manufacturing technique in view of device performance and/or power consumption and/or cost efficiency. In integrated circuits including logic portions fabricated by MOS technology, field effect transistors (FETs) are provided that are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

On the basis of the field effect transistors, more complex circuit components may be composed, such as inverters and the like, thereby forming complex logic circuitry, embedded memories and the like. Due to the reduced dimensions, the operating speed of the circuit components has been increased with every new device generation, wherein, however, the limiting factor of the finally achieved operating speed of complex integrated circuits is no longer the individual transistor element but the electrical performance of the complex wiring system, which may be formed above the device level including the actual semiconductor-based circuit elements, such as transistors and the like. Typically, due to the large number of circuit elements and the required complex layout of modern integrated circuits, the electrical connections of the individual circuit elements cannot be established within the same device level on which the circuit elements are manufactured, but require one or more additional metallization layers, which generally include metal-containing lines providing the inner-level electrical connection, and also include a plurality of inter-level connections or vertical connections, which are also referred to as vias. These vertical interconnect structures comprise an appropriate metal and provide the electrical connection of the various stacked metallization layers.

Furthermore, in order to actually connect the circuit elements formed in the semiconductor material with the metallization layers, an appropriate vertical contact structure is provided, which connects, with one end, to a respective contact region of a circuit element, such as a gate electrode and/or the drain and source regions of transistors, and, with another end, to a respective metal line in the metallization layer and/or to a contact region of a further semiconductor-based circuit element, in which case the interconnect structure in the contact level is also referred to as a local interconnect. The contact structure may comprise contact elements or contact plugs having a generally square-like or round shape that are formed in an interlayer dielectric material, which in turn encloses and passivates the circuit elements. Upon further shrinkage of the critical dimensions of the circuit elements in the device level, the dimensions of metal lines, vias and contact elements also have to be adapted to the reduced dimensions, thereby requiring sophisticated metal-containing materials and dielectric materials in order to reduce the parasitic capacitance in the metallization layers and provide a sufficiently high conductivity of the individual metal lines and vias. For example, in complex metallization systems, copper in combination with low-k dielectric materials, which are to be understood as dielectric materials having a dielectric constant of approximately 3.0 or less, are typically used in order to achieve the required electrical performance and the electro-migration behavior as is required in view of reliability of the integrated circuits. Consequently, in lower-lying metallization levels, metal lines and vias having critical dimensions of approximately 100 nm and significantly less may have to be provided in order to achieve the required "packing density" in accordance with density of circuit elements in the device level.

Upon further reducing the dimensions of the circuit elements, for instance using critical dimensions of 50 nm and less, the contact elements in the contact level have to be provided with critical dimensions in the same order of magnitude. The contact elements typically represent plugs, which are formed of an appropriate metal or metal composition, wherein, in sophisticated semiconductor devices, tungsten in combination with appropriate barrier materials has proven to be a viable contact metal. When forming tungsten-based contact elements, typically the interlayer dielectric material is formed first and is patterned so as to receive contact openings, which extend through the interlayer dielectric material to the corresponding contact areas of the circuit elements. In particular, in densely packed device regions, the lateral size of the drain and source areas and thus the available area for the contact regions is 100 nm and significantly less, thereby requiring extremely complex lithography and etch techniques in order to form the contact openings with well-defined lateral dimensions and with a high degree of alignment accuracy.

For this reason, contact technologies have been developed in which contact openings are formed in a self-aligned manner by removing dielectric material, such as silicon dioxide, selectively from the spaces between closely spaced gate electrode structures. That is, after completing the transistor structure, the gate electrode structures are used as etch masks for selectively removing the silicon dioxide material in order to expose the contact regions of the transistors, thereby providing self-aligned trenches which are substantially laterally delineated by the spacer structures of the gate electrode structures. Consequently, a corresponding lithography process only needs to define a global contact opening above an active region, wherein the contact trenches then result from the selective etch process using the gate electrode structures, i.e., the portions exposed by the global contact opening, as an etch mask. Thereafter, an appropriate contact material, such as tungsten and the like, may be filled into the contact trenches.

Moreover, generally, a reduction of length of the channel regions is associated with the requirement of an increase of the capacitive coupling between the gate electrode and the channel region, in particular in high performance transistors, and for this reason typically the gate dielectric material separating the channel region from an electrode material of the gate electrode structures is reduced in thickness. In the past, silicon dioxide-based gate dielectric materials have been used due to the superior characteristics of a silicon/silicon dioxide interface with respect to high temperature treatments and the like, wherein, however, upon continuously shrinking the critical dimensions of the transistors, the moderately low dielectric constant of silicon dioxide-based dielectric materials may require a thickness of 2 nm and less of a corresponding gate insulation layer in order to comply with the performance requirements of transistors having a gate length well below 80 nm. In this case, however, the resulting leakage currents caused by hot carrier injection and direct tunneling of charge carriers through the extremely thin silicon dioxide-based gate dielectric may no longer be compatible with thermal design power requirements. Therefore, new strategies have been developed in which at least a significant portion of the conventional gate dielectric material is replaced by a dielectric material of increased dielectric constant, wherein any such materials are typically referred to as high-k dielectric materials and have a dielectric constant of 10.0 and higher. For example, a plurality of metal oxides and silicates, such as hafnium oxide, zirconium oxide and the like, may be efficiently used as high-k dielectric materials. It turns out, however, that the incorporation of the high-k dielectric material also requires appropriately adapted strategies for adjusting the work function values of the gate electrode structures, which in turn requires the incorporation of specific work function metal species, such as titanium, tantalum, aluminum, lanthanum and the like, which may also be used as efficient electrode metals, thereby also increasing electrical conductivity and reducing generation of any depletion zones in the vicinity of the gate dielectric material, as is also typically encountered in conventional silicon dioxide/polysilicon gate electrode structures. Since the high-k dielectric materials and the work function metal species may be highly sensitive with respect to high temperature treatments and the exposure to critical process atmospheres, as are typically encountered during the entire manufacturing process, in some very promising approaches these materials are provided in a very late manufacturing stage on the basis of a so-called replacement gate approach.

In sophisticated process strategies, the replacement gate approach is typically combined with a self-aligned formation of the contact elements, as discussed above, wherein the contact elements are formed prior to applying the replacement gate approach in order to provide a fully encapsulated replacement gate electrode structure for enabling the application of a selective etch strategy, as described above. In this case, however, the further processing, i.e., applying the replacement gate approach, may be significantly affected by the presence of the metal in the contact elements, as will be described in more detail with reference to FIG. 1.

FIG. 1 schematically illustrates a cross-sectional view of a semiconductor device 100 in a very advanced manufacturing stage. As illustrated, the device 100 comprises a substrate 101, such as a silicon substrate or any other appropriate carrier material, above which is formed a semiconductor layer 102, such as a silicon layer and the like. The semiconductor layer 102 is laterally divided into a plurality of semiconductor regions or active regions, wherein, for convenience, a single active region 102a is illustrated in FIG. 1. Generally, an active region is to be understood as a semiconductor region in the layer 102, in and above which one or more transistors are to be formed. The active region 102a is laterally delineated by an isolation region 102c, which is typically provided in the form of a shallow trench isolation (STI). Moreover, in the manufacturing stage shown, a plurality of transistors, such as P-channel transistors or N-channel transistors, are formed in and above the active region 102a and comprise corresponding drain and source regions 151, which may have any appropriate lateral and vertical profile in accordance with the overall process and device requirements. For example, the drain and source regions 151 may be comprised of dopant species incorporated by implantation techniques, selective epitaxial growth techniques and the like. Furthermore, in some cases, a strain-inducing semiconductor alloy, such as a silicon/germanium material, a silicon/tin material, a silicon/carbon material and the like, may be incorporated in at least a portion of the drain and source regions 151 so as to induce a desired type of strain in a channel region 153 of the transistors. Furthermore, each of the transistors comprises a gate electrode structure 160 which, in the manufacturing stage shown, is to be understood as a replacement gate electrode structure since significant portions thereof are to be replaced by appropriate gate materials in a later manufacturing stage. The gate electrode structures may comprise a dielectric material or etch stop material 162, such as silicon dioxide and the like, followed by a placeholder material 161, which is typically provided in the form of a polysilicon material, which in turn is covered by a dielectric cap layer or layer system 164, for instance provided in the form of a silicon nitride material. Furthermore, a sidewall spacer structure 163, which may be comprised of several spacer elements and the like, is provided so as to confine the material 161 at sidewalls thereof. For example, the spacer structure 163 typically comprises at least one spacer element formed of silicon nitride. The gate electrode structures 160 may have a gate length, i.e., in FIG. 1, the horizontal extension of the placeholder material 161, of 50 nm and significantly less, such as 30 nm, so that a spacing, indicated as 122a, between adjacent gate electrode structures 160 may be on the order of magnitude of 100 nm and significantly less. Consequently, implementing a self-aligned manufacturing strategy for forming contact elements so as to connect to contact regions of the transistors, i.e., to a portion of the drain and source regions 151, may thus provide significant enhancement with respect to process robustness and reliability of the resulting contact elements, as discussed above.

Furthermore, in this manufacturing stage, an interlayer dielectric material 121, such as a silicon dioxide material, is provided above the semiconductor layer 102 and has formed therein an appropriate "global" contact opening 121a, which thus defines the lateral size and position above the active region 102a in which the contact regions of the drain and source regions 151 are exposed.

The semiconductor device 100 as shown in FIG. 1 may be formed on the basis of any appropriate process strategy. For example, the isolation region 102c is formed in the semiconductor layer 102 by applying well-established lithography, etch, deposition, anneal and polishing techniques, thereby laterally delineating the active region 102a. Prior to or after providing the isolation region 102c, any appropriate well dopant species may be incorporated, for instance by ion implantation, followed by anneal processes and the like. Next, appropriate materials for the gate electrode structures 160 are formed, for instance by deposition and the like, followed by any appropriate complex patterning regime so as to pattern the materials 161, 162 and 164 with the desired lateral dimensions in accordance with the overall design rules.

Thereafter, any further processes may be applied so as to complete the transistor structures, which may include the incorporation of strain-inducing materials (not shown), the introduction of dopant species for the drain and source regions 151, the provision of the spacer structure 163 and the like, which may be accomplished by applying any appropriate process strategy. Consequently, in this manufacturing stage, the placeholder material 161 is reliably encapsulated by the cap layer 164 and the spacer structure 163. In some cases, appropriate contact regions may be formed, for instance, by incorporating a metal silicide in the drain and source regions 151, while, in other cases, a corresponding metal silicide may be provided in a later manufacturing stage. Next, the interlayer dielectric material 121 may be deposited, for instance by applying any appropriate deposition technique, such as spin-on techniques, in combination with subsequent treatments in the form of anneal processes and the like so as to provide the material 121 with desired characteristics. For example, silicon dioxide material, possibly in combination with an etch stop layer, such as silicon nitride (not shown), may be provided laterally adjacent and above the gate electrode structures 160. If required, a planarization process may be applied, while in other cases an appropriate lithography process is performed in order to provide an etch mask that defines the lateral size and position of the opening 121a. Thereafter, a selective etch process is applied, for instance by using well-established plasma assisted etch recipes, in order to remove an exposed portion of the material 121, while the cap layer 164 and the spacer structure 163, possibly in combination with an additional etch stop layer, may act as etch masks and etch stop materials, respectively. Thereafter, any residual materials, such as etch stop materials, may be removed by using any appropriate etch or cleaning recipe while still reliably preserving the materials 164 and 163. Next, any appropriate contact materials, such as titanium nitride in combination with tungsten, may be deposited, thereby reliably filling the spaces 122a which now act as contact openings, thereby forming corresponding contact elements in a self-aligned manner. Thereafter, any excess material may be removed, for instance by using a chemical mechanical polishing (CMP) process, wherein, in a final phase, the tungsten material in the contact openings 121a and the dielectric cap material 164 in combination with the interlayer dielectric material 121 is to be removed, wherein preferably a very similar removal rate for the three different materials is to be accomplished in order to avoid undue recessing or dishing of the contact metal, while nevertheless reliably exposing the placeholder material 161 in the gate electrode structures 160. It should be appreciated that a corresponding polishing recipe is very difficult to establish and thus significant process non-uniformities may typically be associated with the corresponding planarization process. In other cases, any additional etch and cleaning processes may be required, which in turn, however, may have a significant influence on the previously formed contact metal.

After the exposure of the placeholder polysilicon material 161, corresponding selective etch recipes have to be applied in order to reliably remove the material 161, while, however, also avoiding undue material erosion in the contact elements formed in the openings 121a. After the removal of the polysilicon material 161 and possibly of the material 162, efficient cleaning recipes, for instance for removing residual oxide materials, may have to be applied, wherein, however, well-established and highly efficient cleaning agents, such as APM/SPM (ammonium hydrogen peroxide mixture/sulfuric acid hydrogen peroxide mixture) may not be available since these agents also "efficiently" remove tungsten, thereby significantly damaging the contact elements. Furthermore, during the subsequent processing, i.e., the deposition of the different work function metals and the patterning thereof, a high probability may exist for damaging the contact elements so that, generally, significant yield loss is observed when forming self-aligned contact elements in the context of sophisticated replacement gate approaches.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques and semiconductor devices in which self-aligned contact elements may be provided in the context of a replacement gate approach by applying the replacement gate approach first on the basis of a specifically selected placeholder material, while the self-aligned contact openings are filled with an appropriate sacrificial fill material. The etch characteristics are specifically selected in accordance with the dedicated placeholder material of the gate electrode structures. Consequently, the replacement gate approach may be applied on the basis of any appropriate cleaning recipes, deposition and etch techniques, while the contact openings, previously formed on the basis of a self-aligned etch technique, are reliably filled by the sacrificial fill material, which may then be removed on the basis of highly selective etch recipes so as to enable the subsequent deposition of any appropriate contact metal or material.

One illustrative method disclosed herein comprises forming a sacrificial fill material laterally adjacent to and above a gate electrode structure formed on an active region of a semiconductor device, wherein the gate electrode structure comprises a placeholder material. The method further comprises exposing a surface of the placeholder material by planarizing the sacrificial fill material. The method additionally comprises replacing the placeholder material with at least one electrode metal in the presence of the sacrificial fill material. Moreover, the method comprises removing the sacrificial fill material so as to expose a contact region of the active region after replacing the placeholder material. The method further comprises forming a conductive material on the exposed contact region so as to form a contact element.

A further illustrative method disclosed herein comprises forming a gate electrode structure on an active region of a semiconductor device, wherein the gate electrode structure comprises a semiconductor-containing placeholder material. The method further comprises forming an interlayer dielectric material above and adjacent to the active region. Moreover, the interlayer dielectric material is selectively removed from above at least a portion of the active region so as to form contact openings laterally adjacent to the gate electrode structure. Furthermore, the method comprises forming a semiconductor-containing sacrificial fill material in the contact openings. Additionally, the method comprises replacing the placeholder material of the gate electrode structure at least with a metal-containing electrode material in the presence of the sacrificial fill material.

One illustrative semiconductor device disclosed herein comprises a plurality of gate electrode structures formed on an active region, wherein each of the plurality of gate electrode structures comprises a high-k dielectric material, an electrode metal and a dielectric sidewall spacer structure. The semiconductor device further comprises a contact element formed laterally between two of the plurality of gate electrode structures and connecting to the active region, wherein the contact element is delineated in a length direction by the dielectric spacer structure and comprises a metal having a thermal stability that is less than a thermal stability of tungsten.

BRIEF DESCRIPTION OF THE DRAWINGS

The disclosure may be understood by reference to the following description taken in conjunction with the accompanying drawings, in which like reference numerals identify like elements, and in which.

Figure 1:
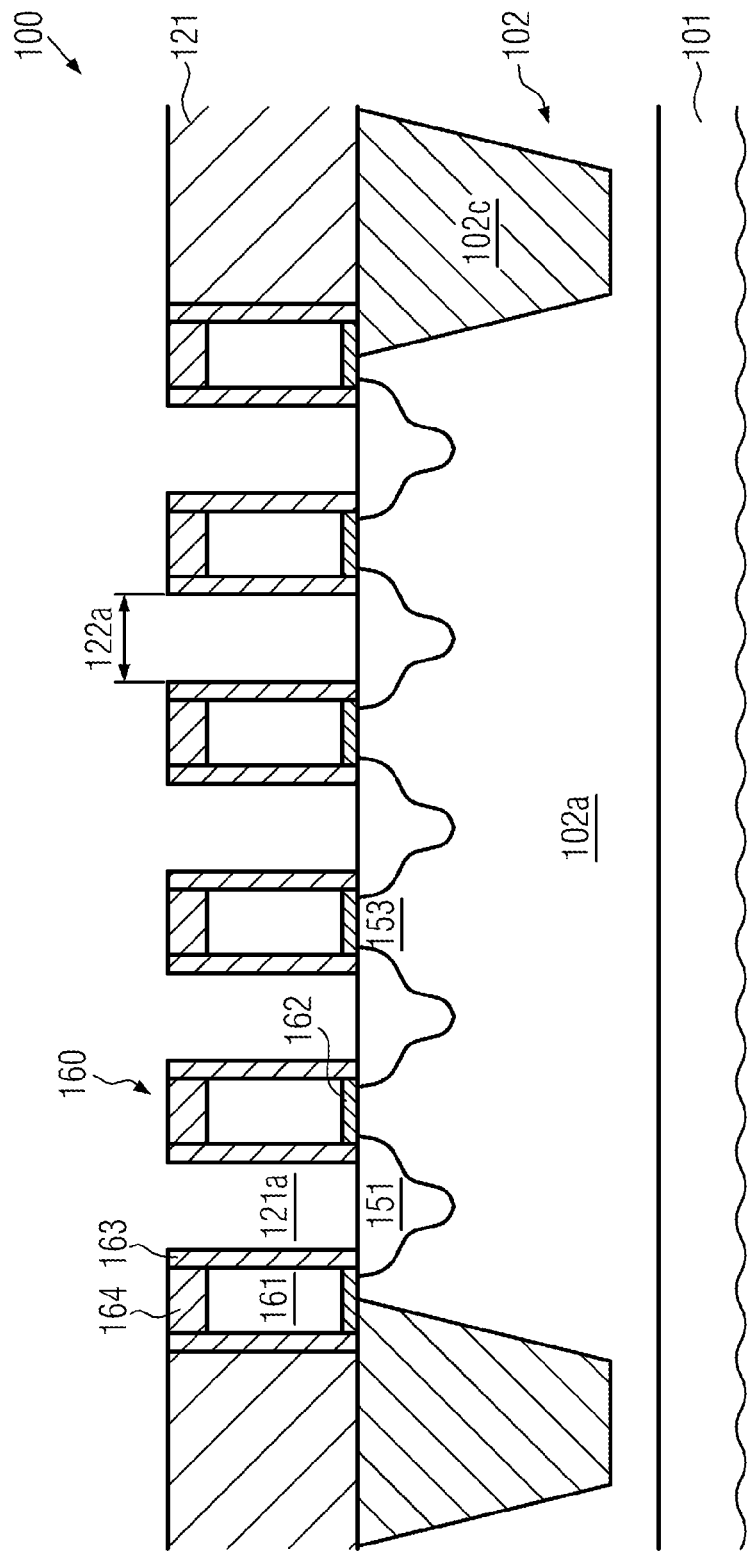
FIG. 1 schematically illustrates a cross-sectional view of a semiconductor device in a manufacturing stage in which self-aligned contact openings and contact elements are formed prior to applying a replacement gate approach, according to conventional strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally provides manufacturing techniques and semiconductor devices in which a replacement gate approach may be applied substantially without affecting contact elements, which are provided in a self-aligned manner. To this end, contact openings may be provided in a self-aligned manner while a placeholder material of the gate electrode structures is still reliably encapsulated by any appropriate dielectric materials, such as a cap layer, a spacer structure and the like. In this manufacturing stage, the configuration of the transistor elements may be completed, for instance, by incorporating any appropriate metal/semiconductor compound, such as a metal silicide, into contact areas through the previously formed self-aligned contact openings, while the gate electrode structures are still provided in their encapsulated configuration. Thereafter, the contact openings may be filled with an appropriate sacrificial fill material, wherein the material characteristics of the fill material and of the placeholder material of the gate electrode structures are appropriately selected so as to allow selective removal of these materials with respect to each other and also provide sufficient etch stop capabilities during the application of the complex replacement gate approach. Thereafter, the fill material may be efficiently removed due to the appropriately selected material characteristics thereof and any desired contact material may then be formed in the contact openings, wherein, in some illustrative embodiments, even metals with reduced thermal stability compared to tungsten, such as aluminum and the like, may be provided since any high temperature processes as may be required during the replacement gate approach have been completed on the basis of the sacrificial fill material.

With respect to FIGS. 2a-2k, further illustrative embodiments will now be described in more detail, wherein reference may also be made to FIG. 1, if required.

Figure 2A:
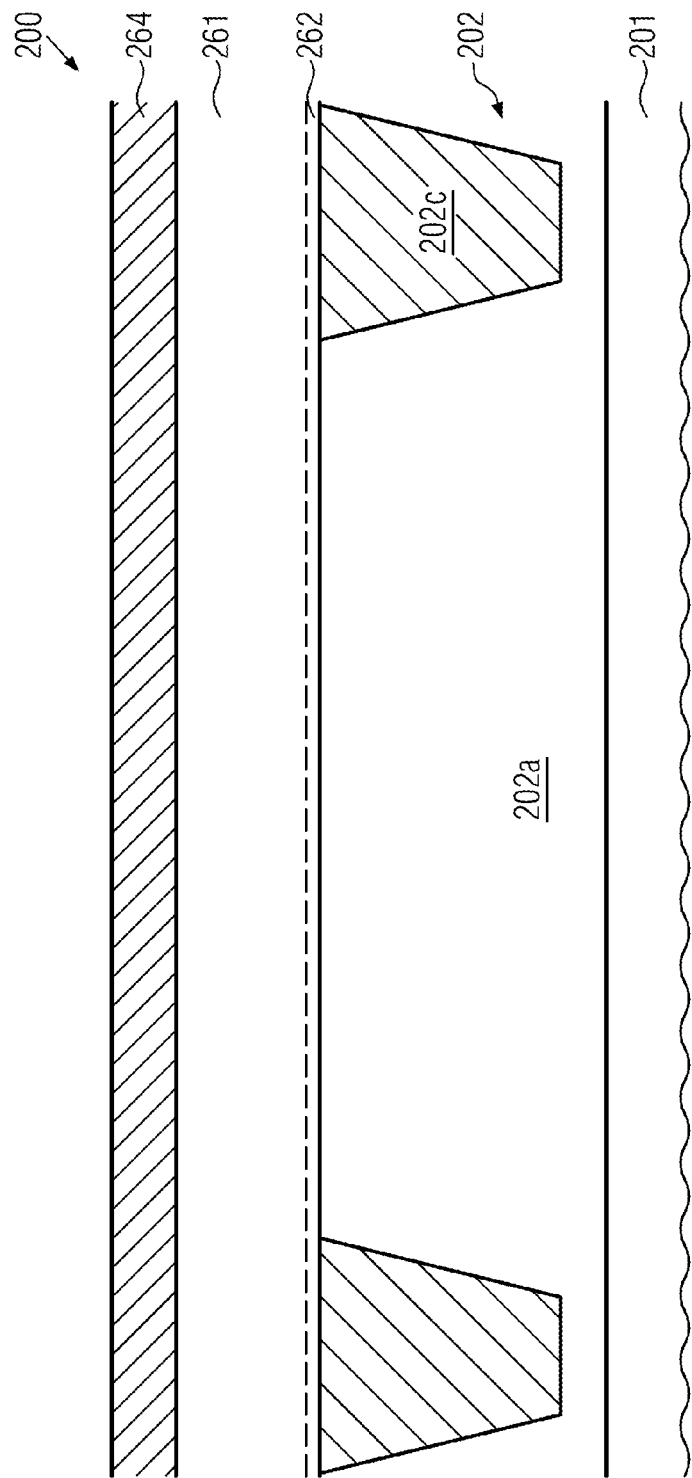
FIGS. 2a-2k schematically illustrate cross-sectional views of a semiconductor device during various manufacturing stages in which a replacement gate approach is applied prior to filling self-aligned contact openings with an appropriate contact material, according to illustrative embodiments.

FIG. 2a schematically illustrates a cross-sectional view of a semiconductor device 200 in an early manufacturing stage. That is, the device 200 comprises a substrate 201, above which may be formed a semiconductor layer 202, in which a plurality of active regions, such as an active region 202a, may be laterally delineated by an isolation region 202c. The semiconductor layer 202 may be provided in the form of any appropriate semiconductor material, such as silicon, silicon/germanium and the like, wherein, if a silicon-on-insulator (SOI) architecture is to be considered, a buried insulating material (not shown) may be formed directly below the semiconductor layer 202. In other cases, a bulk configuration may be used in which the semiconductor material of the layer 202 and of the active region 202a is directly connected to a crystalline material of the substrate 201. Moreover, in this manufacturing stage, a stack of layers 261 and 264 may be provided, possibly in combination with a dielectric material or etch stop material 262 in order to form a gate electrode structure, which is to be used as a placeholder gate electrode structure, as is also discussed above with reference to the semiconductor device 100. For example, the layer 261 is to be considered as a placeholder material, which is to be replaced in a late manufacturing stage upon performing a replacement gate approach, as described above. Furthermore, the layer or layer system 264 may act as a dielectric cap layer and may be comprised of silicon nitride, possibly in combination with silicon dioxide and the like. Similarly, the layer 262 may be provided in the form of a silicon dioxide material, silicon nitride, silicon oxynitride, a high-k dielectric material, such as hafnium oxide, possibly in combination with silicon and the like. In one illustrative embodiment, the placeholder material 261 is provided as a semiconductor base material which may enable the usage of well-established etch recipes, for instance upon patterning the layer stack, i.e., the layers 264, 261 and 262, while also providing a desired high etch rate compared to a sacrificial fill material that is to be provided in a very late manufacturing stage. To this end, in one illustrative embodiment, the layer 261 is applied as a silicon/germanium material, wherein the germanium content may be approximately 10-50 percent or even higher, depending on the overall process strategy. It is well known that a silicon/germanium mixture may be efficiently etched selectively with respect to silicon dioxide, silicon nitride, polysilicon and the like, on the basis of well-established wet chemical etch chemistries, plasma assisted etch recipes and the like. For example, a plurality of wet chemical etch chemistries, which are known to remove silicon material, may be appropriately tuned so as to preferably etch silicon/germanium material compared to a substantially pure silicon material, thereby enabling the usage of a polysilicon material as an efficient etch mask or etch stop material in a later manufacturing stage. On the other hand, well-established patterning strategies may be efficiently applied to a silicon/germanium material since, in many conventional semiconductor materials, a silicon/germanium material may frequently be used as an efficient electrode material for gate electrode structures.

The semiconductor device 200 as shown in FIG. 2a may be formed on the basis of any appropriate process strategy, for instance, for forming the isolation region 202c and the active region 202a, as also discussed above with reference to the device 100. The dielectric material 262, if provided, may be formed by oxidation, deposition and the like, followed by the deposition of the placeholder material 261, wherein well-established low pressure chemical vapor deposition (CVD) techniques may be applied in which the precursor materials are appropriately selected so as to obtain the desired material composition. For example, silicon-containing materials and germanium-containing materials, such as germanium hydride and the like, may be used in order to form a silicon/germanium material having a desired germanium concentration. Thereafter, the one or more cap layers 264 may be deposited, for instance, by plasma assisted CVD and the like.

Figure 2B:
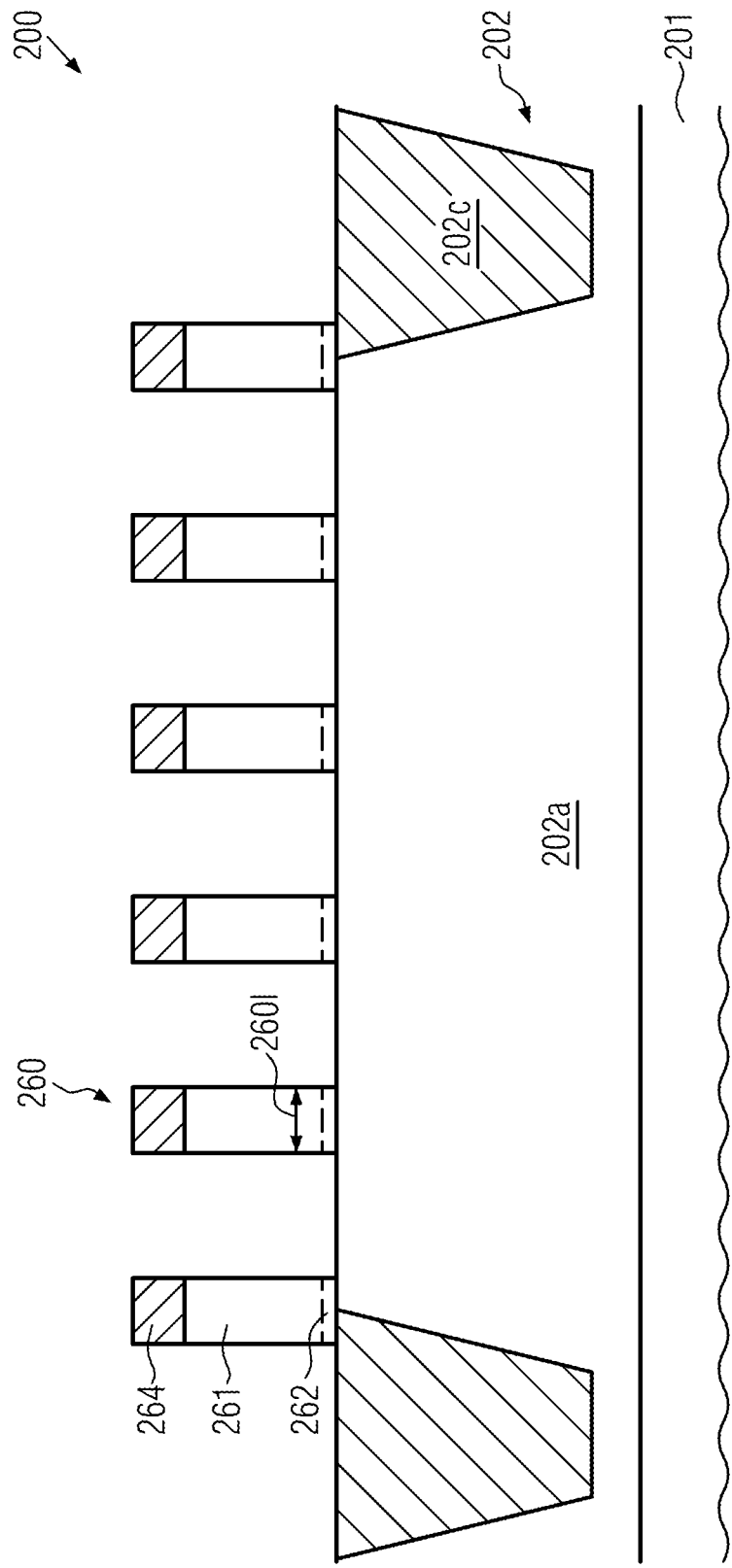

FIG. 2b schematically illustrates the device 200 in a further advanced manufacturing stage in which gate electrode structures 260 may be formed on the active region 202a, wherein one or more of the gate electrode structures 260 may also be formed partially above the isolation region 202c, for instance acting as dummy structures in order to provide superior patterning conditions and the like. The patterning of the gate electrode structures 260 may be accomplished by using any sophisticated lithography and etch techniques, for instance including double exposure/double etch strategies in order to appropriately pattern the cap layer 264, which may then act as an appropriate hard mask material for patterning the materials 261 and 262. As discussed above, in particular when using a silicon/germanium material, well-established etch recipes may be applied, thereby providing a high degree of compatibility with conventional gate patterning techniques. It should be appreciated, however, that the material 261 may also be provided in the form of a different material as long as the material 261 may be patterned in an appropriate manner for providing the gate electrode structures 260 with desired lateral dimensions, such as a gate length 2601 in accordance with the overall design rules. Furthermore, the material 261 has to be removed very efficiently during a replacement gate approach selectively with respect to typical dielectric materials, such as silicon dioxide, silicon nitride and a sacrificial fill material, which may be provided in a later manufacturing stage.

On the basis of the gate electrode structures 260, further processes may be applied in order to complete the transistor structures in and above the active region 202a, which may comprise the incorporation of a strain-inducing semiconductor material (not shown), the introduction of appropriate dopant species, the formation of spacer structures and the like.

Figure 2C:
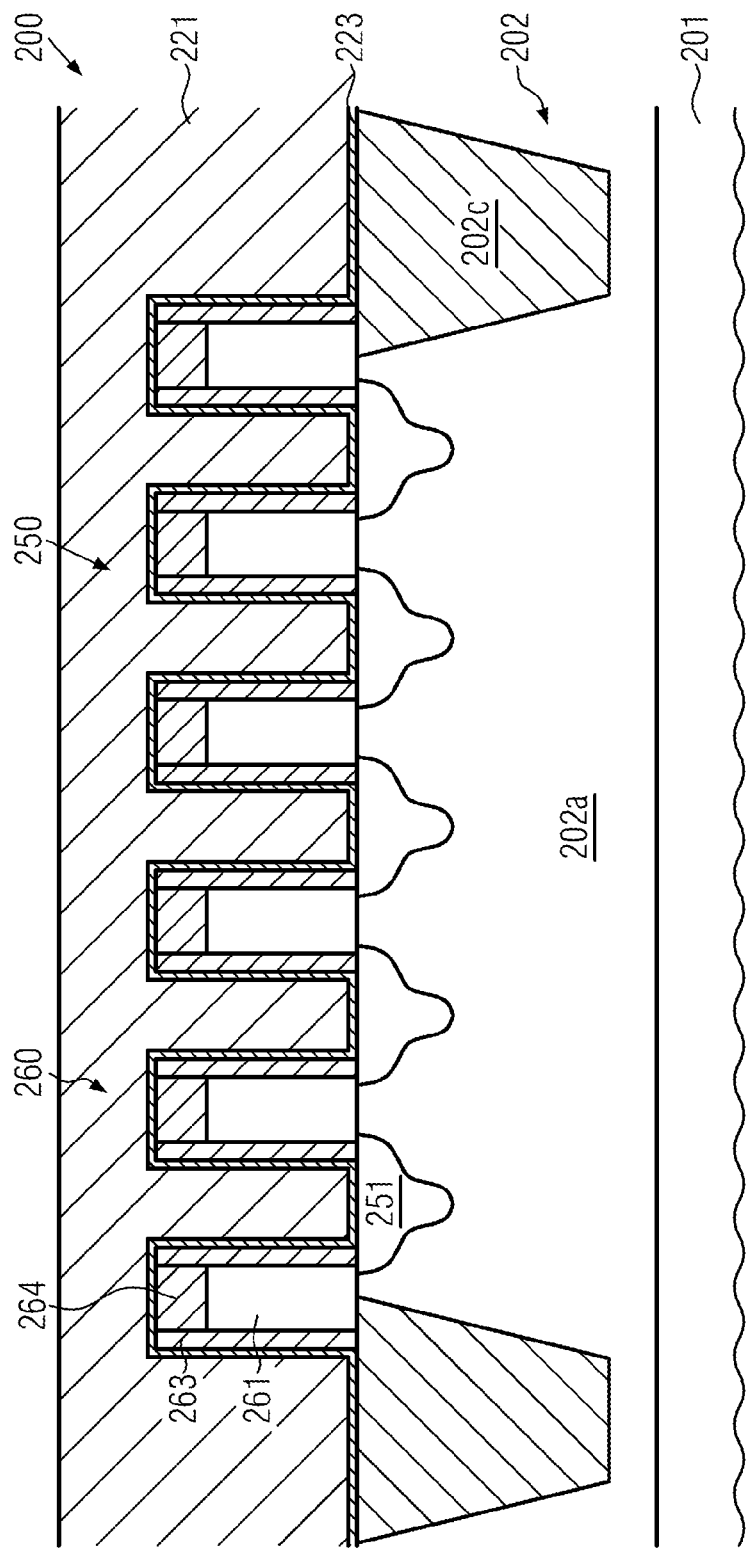

FIG. 2c schematically illustrates the semiconductor device 200 in a further advanced manufacturing stage. As shown, a plurality of transistors 250 are formed in and above the active region 202a and comprise the gate electrode structures 260. The transistors 250 may comprise drain and source regions 251 of any appropriate configuration, for instance in terms of dopant concentration, dopant profile and the like, wherein also, as discussed above, a strain-inducing semiconductor material may be incorporated in at least a part of the drain and source regions 251 of some of the transistors 250. Furthermore, the gate electrode structures 260 may comprise a spacer structure 263, for instance in the form of a silicon nitride material, a silicon dioxide material and the like, wherein a width may be selected in accordance with overall device requirements. For example, a width of the spacer structure 263 may be 6-50 nm in sophisticated applications in which a gate length may be approximately 30 nm and less. It should be appreciated, however, that the dimensions of the various components may be readily adjusted with respect to the overall design rules. Consequently, a spacing between neighboring gate electrode structures 260 may be in the range of 50 nm and significantly less. Moreover, in the manufacturing stage shown, an interlayer dielectric material 221, such as a silicon dioxide material and the like, may be formed above and laterally adjacent to the gate electrode structures 260 and also above any other device regions of the device 200. Consequently, the spaces between the gate electrode structures 260 may also be filled with the interlayer dielectric material 221. Furthermore, in the embodiment shown, an etch stop layer 223, such as a silicon nitride material and the like, may be formed below the interlayer dielectric material 221 and may have any appropriate thickness, for instance approximately 10 nm and less, depending on the overall device and process requirements.

Generally, the semiconductor device 200 as shown in FIG. 2c may be formed on the basis of appropriate process techniques as described above in order to complete the basic configuration of the transistors 250, for instance by using the spacer structure 263 and incorporating dopant species by applying implantation techniques and the like. As discussed above, in some cases, dopant species may be incorporated by replacing at least a portion of the material of the active regions 202a by an in situ doped semiconductor material, which in some cases may also provide superior strain conditions within the active region 202a. Thereafter, any high temperature processes may be applied in order to re-crystallize implantation-induced damage and also activate the previously introduced dopant species. Next, the layer 223 may be deposited, for instance, by plasma enhanced CVD, thermally activated CVD, multilayer deposition techniques and the like, in order to provide the material 223 with a desired degree of conformality and a desired layer thickness. Next, the material 221 may be deposited, for instance by using spin-on techniques and the like, thereby filling the spaces between the gate electrode structures and providing a certain degree of overfill of these spaces. For example, a plurality of spin-on recipes are available for providing a silicon dioxide material in a low viscous state, which may be subsequently treated on the basis of elevated temperatures so as to obtain the desired material characteristics.

Figure 2D:
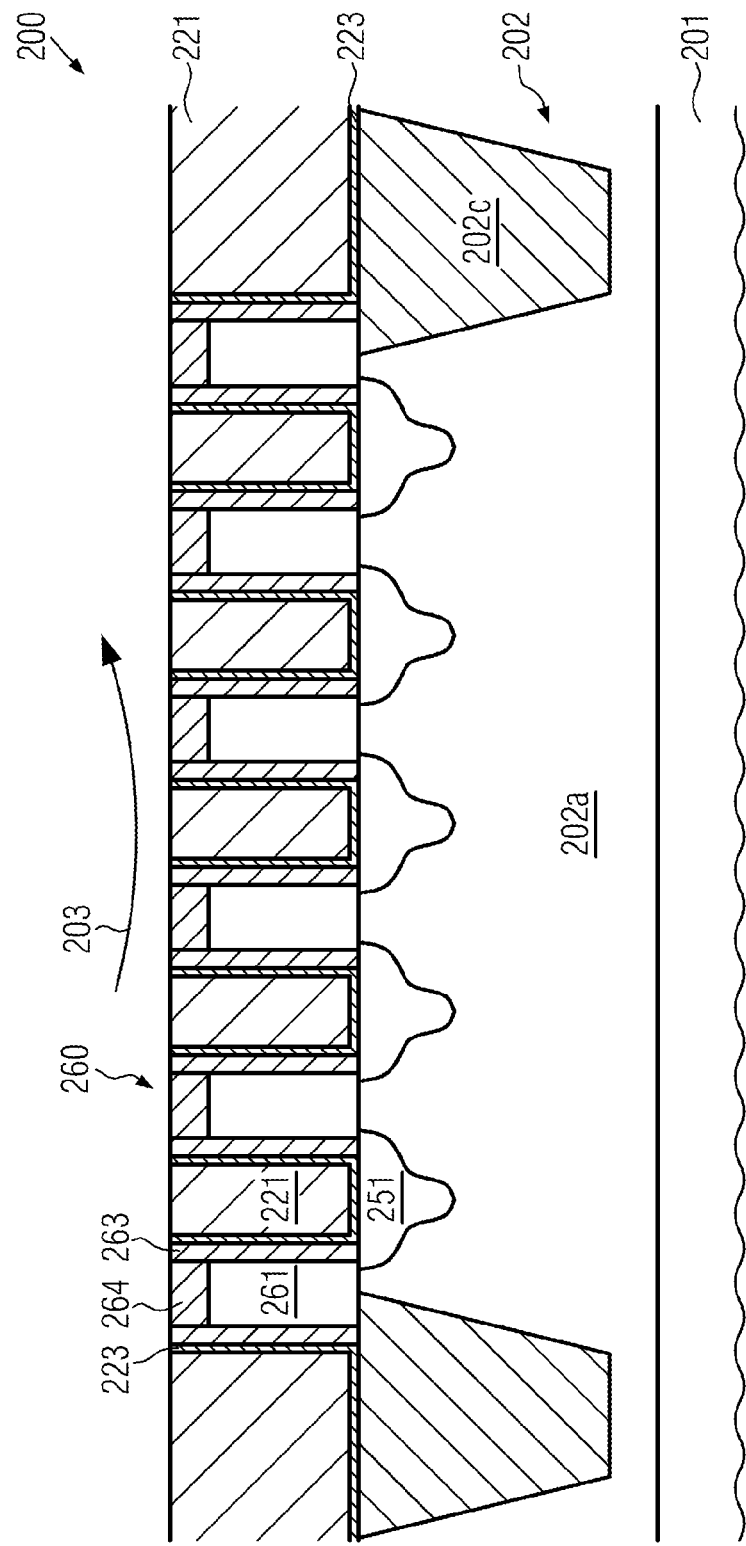

FIG. 2d schematically illustrates the semiconductor device 200 in a stage in which a planarization process 203 may be applied so as to obtain a planarized surface topography, thereby providing superior process conditions for a subsequent lithography process in order to define a global contact opening above the active region 202a. For example, in some illustrative embodiments, the planarization process 203 may be applied as a CMP process in which the dielectric cap layers 264 may be efficiently used as stop material. In this case, a highly selective CMP recipe may be applied in which a silicon dioxide material may be removed with a significantly higher removal rate compared to a silicon nitride material. It should be appreciated that other planarization techniques may be applied, for instance on the basis of etch techniques and the like, possibly in combination with a CMP process, so as to provide superior uniformity of the resulting surface of the device 200. It should further be noted that exposure of the cap layers 264 may not necessarily be required during the removal process 203, however, exposure of the dielectric cap material 264 may be advantageous in terms of reducing the aspect ratio of contact openings still to be formed upon removing unwanted portions of the interlayer dielectric material 221 in a later manufacturing stage.

Figure 2E:
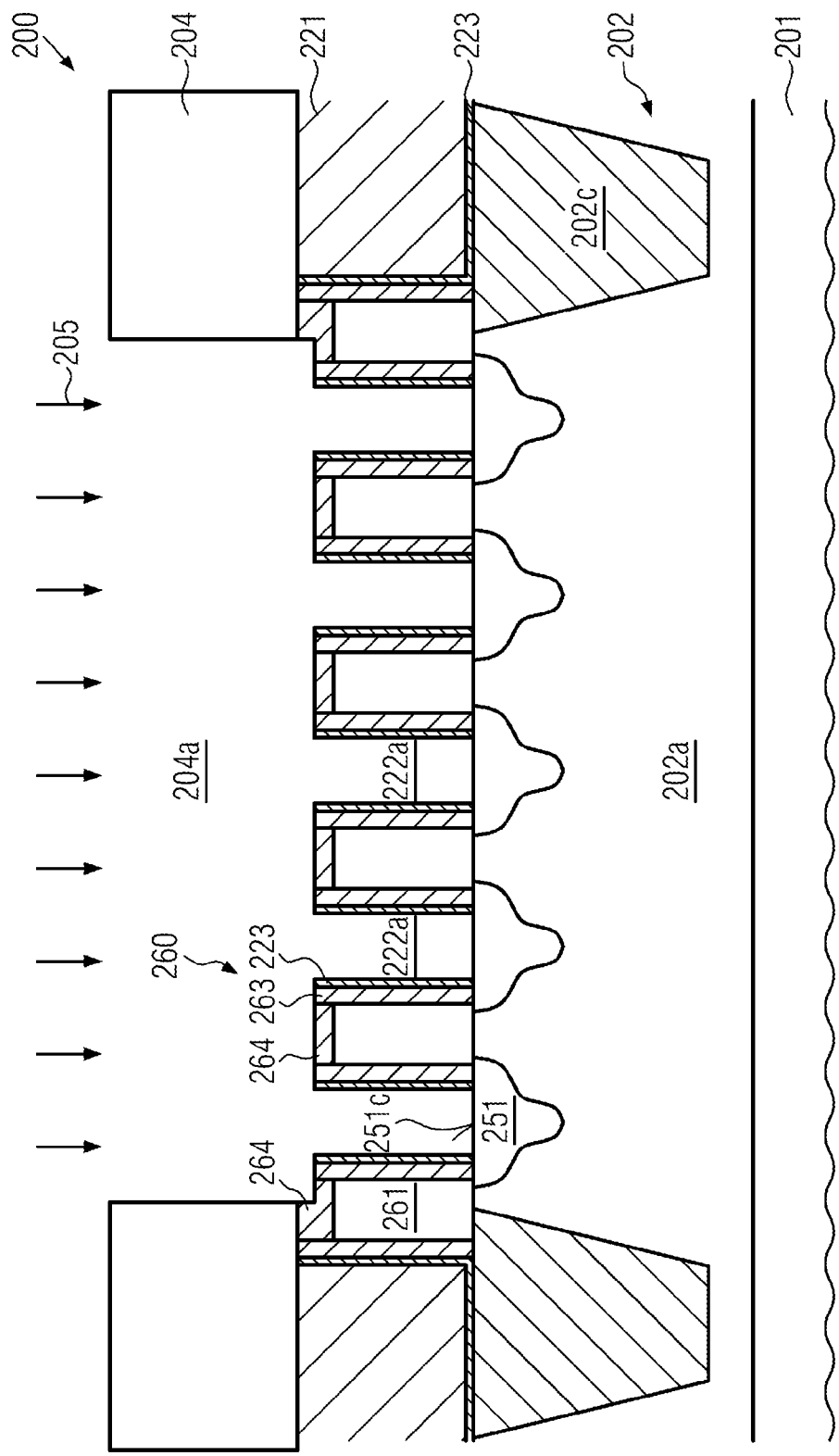

FIG. 2e schematically illustrates the device 200 in a manufacturing stage in which an etch mask 204, such as a resist mask, may be provided so as to define the lateral position, size and shape of a global contact opening 222a by providing an appropriate mask opening 204a in the etch mask 204. To this end, any well-established lithography techniques may be applied wherein generally the size and position of the mask opening 204a is significantly less critical compared to sophisticated patterning techniques in which contact openings have to be aligned with respect to the gate electrode structures, as is also discussed above. It should be noted, however, that the mask opening 204a has to be aligned so as to be laterally delineated above the dummy gate electrode structures formed at the edge of the active region 202a in order to overlap with the isolation region 202c.

After providing the etch mask 204, an etch process 205 may be applied in order to remove exposed portions of the interlayer dielectric material 221 between the gate electrode structures 260, thereby forming contact openings 222a. During the etch process 205, an appropriate etch recipe may be applied to remove the material 221 selectively with respect to, for instance, the cap layer 264, the spacer 263 and the etch stop material 223. To this end, a plurality of highly selective plasma assisted etch recipes are available in order to remove silicon dioxide material selectively with respect to silicon nitride. In other cases, wet chemical etch recipes may be applied, depending on the etch resistivity of the mask 204. Thereafter, a further etch step within the process 205 may be applied so as to remove any residues of the etch stop layer 223 in order to expose contact regions 251c, which may actually represent a portion of the drain and source regions 251, depending on the lateral dimensions of the global contact opening 222a. Furthermore, upon removing the etch mask 204, additional cleaning recipes may be applied so as to remove any etch-associated residue materials and contaminations, while still a significant portion of the dielectric cap layer 264 may be preserved, thereby reliably encapsulating the placeholder material 261. That is, during the etch process 205, a portion of the material 264 may be consumed, for instance approximately half of the material may be consumed, thereby nevertheless reliably covering the material 261. For example, prior to the etch process 205, the cap layer 264 may have a thickness of approximately 40 nm so that approximately 20 nm may still be preserved after the etch process 205.

Figure 2F:
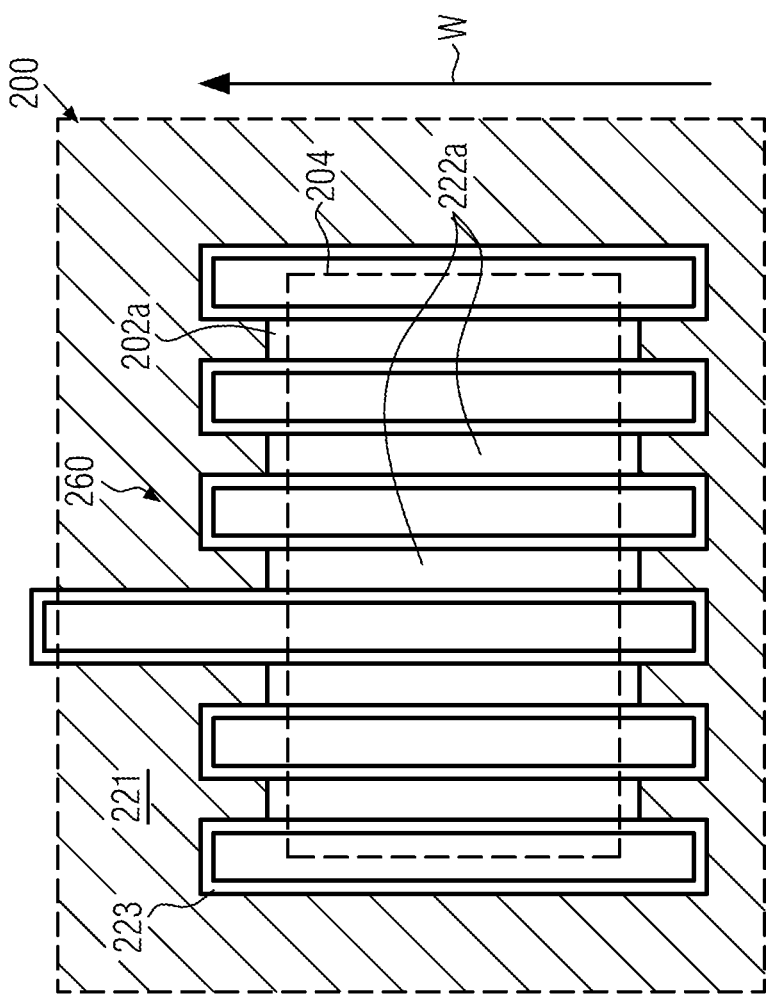

FIG. 2f schematically illustrates a top view of the device 200 after the above-applied etch process. As shown, the gate electrode structures 260 may extend across the active region 202a and may end above the isolation region 202c (FIG. 2e), which is covered by the interlayer dielectric material 221. Moreover, for convenience, the position of the etch mask 204 is indicated. In this case, it is evident that a significant portion of the active region 202a is exposed by the etch mask 204 so that the resulting contact openings 222a form elongated trenches extending along a width direction W of the active region 202a. It should be appreciated, however, that the opening of the etch mask 204 may have any appropriate lateral configuration in order to define, for instance, any "contact exclusion zones" within the active region 202a when the provision of contact elements in such exclusion zones may be considered inappropriate in view of the overall layout of the device 200, for instance with respect to providing connections to the various transistor elements and to the gate electrode structures 260.

Figure 2G:
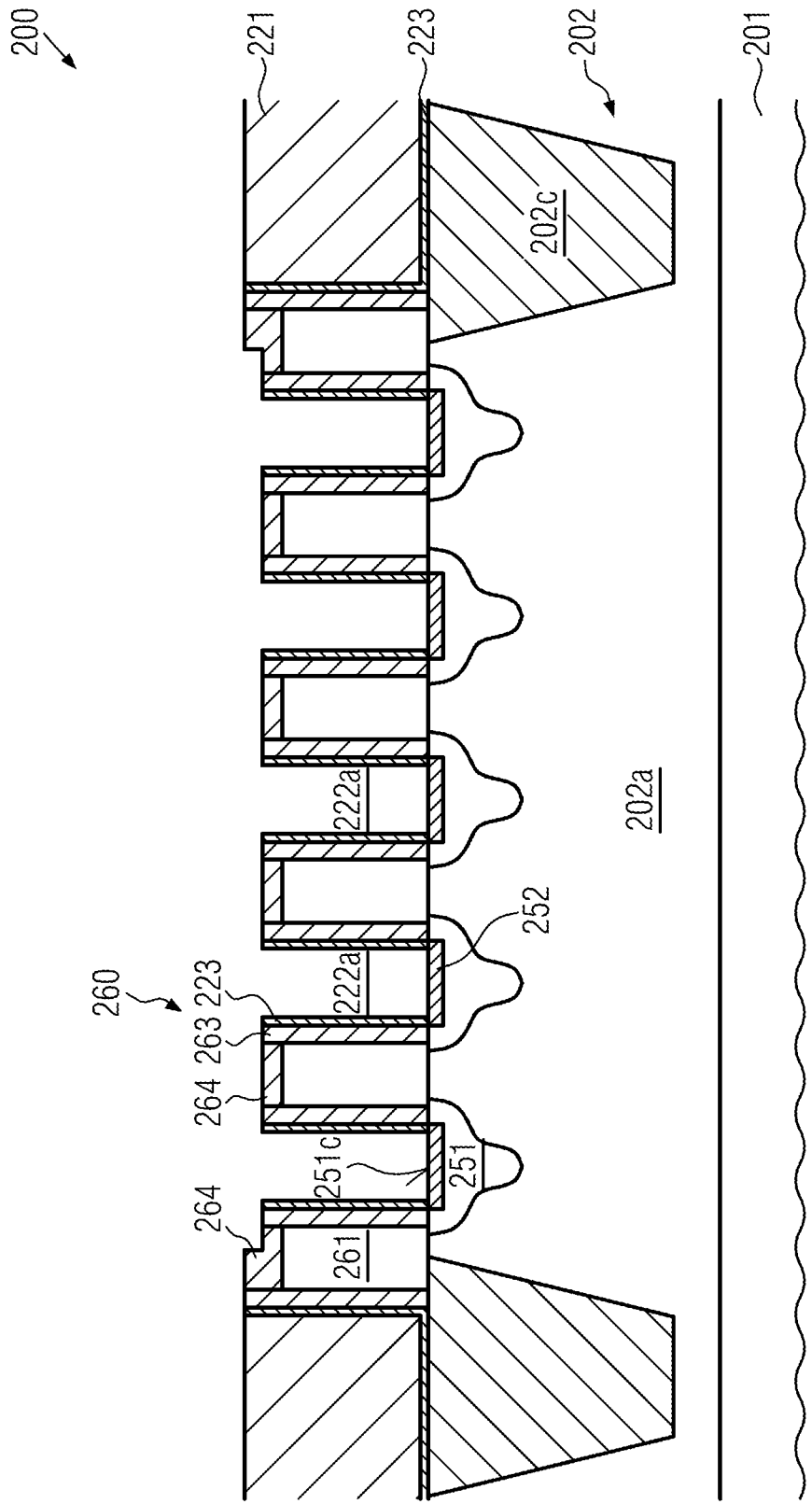

FIG. 2g schematically illustrates the device 200 after forming the contact openings 222a by using a process sequence as discussed above, thereby exposing the contact areas 251c. In some illustrative embodiments, the conductivity of the contact regions 251c may further be enhanced by providing an appropriate metal-containing material 252, for instance in the form of a metal silicide, or generally in the form of a metal/semiconductor compound, depending on the configuration of the drain and source regions 251. For example, appropriate refractory metals, such as nickel, platinum and the like, may be deposited, for instance, by physical vapor deposition followed by an appropriate heat treatment in order to initiate a chemical reaction with the underlying material in the contact areas 251c. For example, a nickel silicide, which may comprise a desired amount of platinum, may be formed during the anneal process, followed by the selective removal of any non-reacted metal material, such as a wet chemical etch recipe used for removing non-reacted material followed by a further heat treatment in order to thermally stabilize the resulting metal/semiconductor regions 252. Thereafter, if platinum is still present, a further wet chemical etch recipe may be applied so as to remove any metal residues. During the entire process sequence for providing the superior material 252 in the contact regions 251c, the gate electrode structures 260 are still reliably confined by the cap layer 264 and the spacer structure 263 in combination with the etch stop layer 223.

Figure 2H:
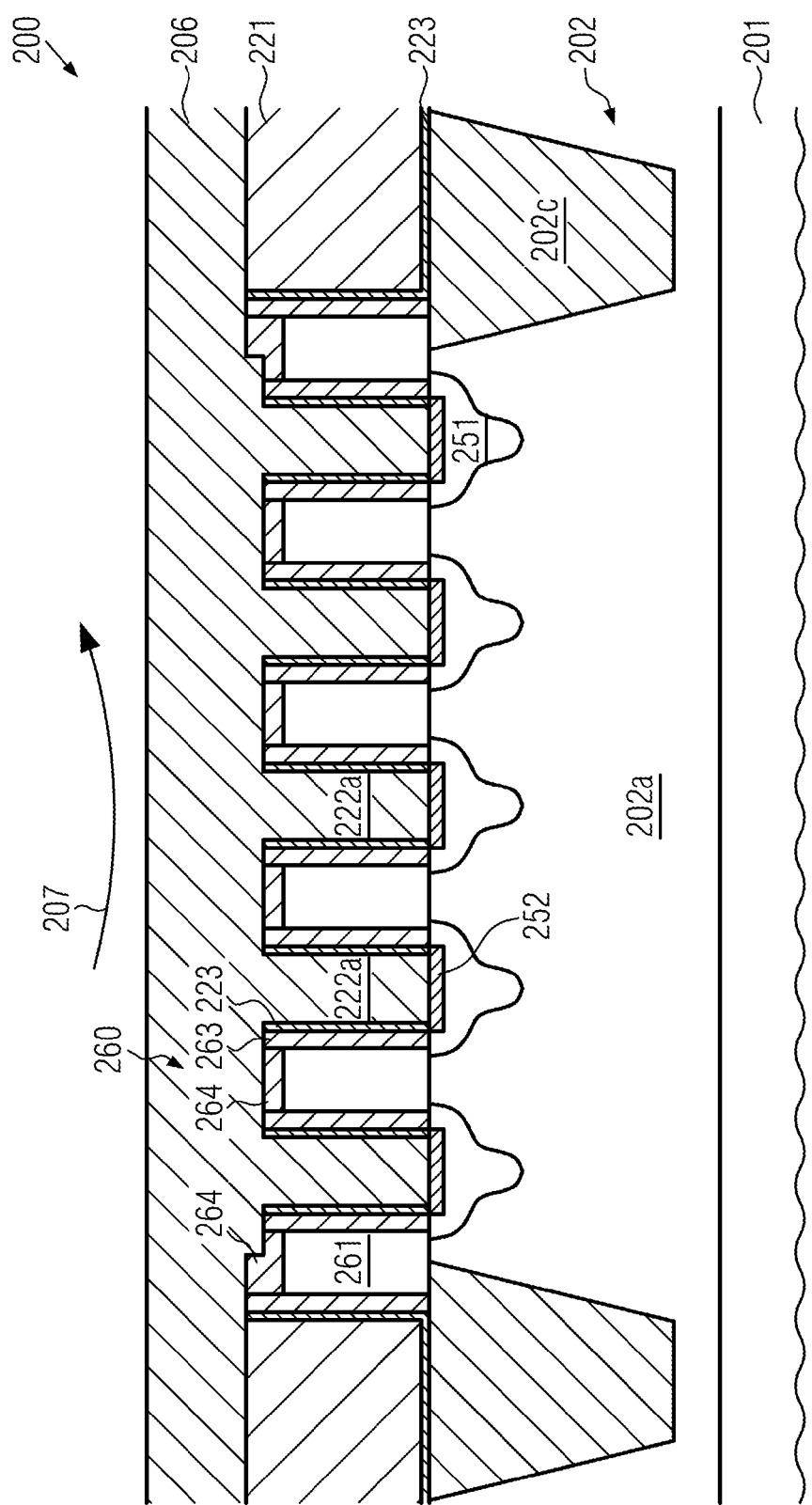

FIG. 2h schematically illustrates the semiconductor device 200 in a further advanced manufacturing stage in which a sacrificial fill material 206 may be formed above the interlayer dielectric material 221 and the gate electrode structures 260, thereby also filling the contact openings 222a. In one illustrative embodiment, the fill material 206 may comprise a semiconductor material which may have a different etch characteristic compared to the placeholder material 261. For example, the layer 206 may be provided in the form of a silicon material, thereby achieving a high etch selectivity with respect to well-established dielectric materials, such as silicon dioxide, silicon nitride and the like, as are typically used in the interlayer dielectric material 221 and the encapsulation of the gate electrode structures 260. It should be appreciated that the sacrificial fill material 206 may also exhibit superior etch resistivity with respect to a plurality of cleaning recipes and etch processes still to be performed upon applying a replacement gate approach so that, for instance, a silicon material may provide a high degree of compatibility with respect to any such process strategies. It is to be noted, however, that any other appropriate fill material may be used, which may have the required etch characteristics during the further processing of the device 200. For example, an etch stop layer (not shown) may be formed prior to the deposition of the actual fill material 206, for instance in the form of a silicon material, a silicon nitride material, a high-k dielectric material, such as hafnium oxide and the like, in order to enable a subsequent efficient removal of the fill material 206 and of a thin etch stop material after having replaced the placeholder material 261.

In one illustrative embodiment, the fill material 206 may be provided in the form of a highly doped silicon material in order to endow the material 206 with a high etch resistivity with respect to an etch recipe that may be used for selectively removing the placeholder material 261 in a later manufacturing stage. For example, it is well known that the incorporation of appropriate dopant species, such as boron and the like, may result in a significantly reduced etch rate with respect to a plurality of wet chemical etch recipes, for instance based on TMAH (tetra methyl ammonium hydroxide), which may be efficiently used for removing silicon material, silicon/germanium material and the like. A corresponding dopant species may be incorporated during the deposition of the fill material 206 by supplying an appropriate precursor gas to the deposition atmosphere, as is well known for forming an in situ doped polysilicon material, which is frequently used for forming conventional gate electrode structures. In this manner, the placeholder material 261 may be provided as a substantially non-doped material and/or germanium contents thereof may be reduced since the pronounced etch selectivity may be accomplished on the basis of increasing the etch resistivity of the sacrificial fill material 206. It should be appreciated that the incorporation of a dopant species into the material 261 during the preceding manufacturing process, for instance for forming the drain and source regions 251 on the basis of implantation processes, may be significantly reduced due to the presence of the cap layer 264 so that a significant difference in the dopant concentration between the material 206 and the placeholder material 261 may still be achieved upon appropriately doping the layer 206.

After depositing the sacrificial fill material 206, possibly in combination with an optional etch stop layer (not shown), which may be accomplished on the basis of well-established low pressure CVD and the like, a planarization process 207 may be applied in order to planarize the layer 206, thereby finally also exposing the placeholder materials 261. For example, in some illustrative embodiments, the planarization process 207 may comprise a CMP process based on a polishing recipe in which, at least in a final phase, the different materials may be removed with a similar removal rate, thereby reliably exposing the placeholder material 261 without causing a pronounced erosion of other materials, such as the fill material 206 and the interlayer dielectric material 221. In other cases, the planarization process 207 may comprise an etch sequence, possibly in combination with a CMP process, depending on the overall process strategy. For example, by using a polysilicon material for the layer 206, well-established CMP recipes for removing silicon dioxide, silicon nitride and polysilicon with substantially identical removal rates may be applied, at least during a final phase of the planarization process 207.

Figure 2I:
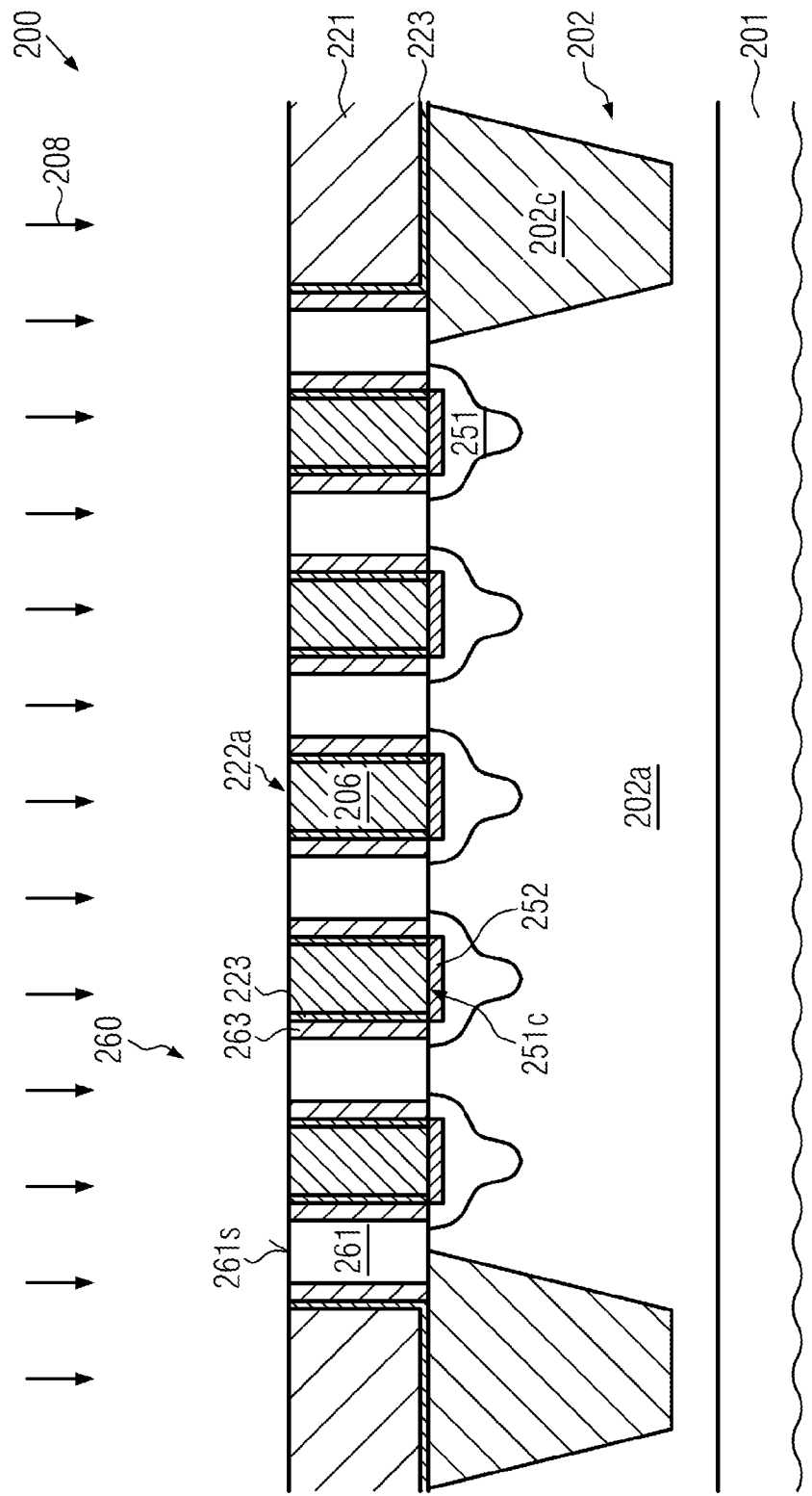

FIG. 2i schematically illustrates the semiconductor device 200 after completing the above-described process sequence. That is, the spaces between the gate electrode structures 260, i.e., the contact openings 222a, are still filled with the sacrificial fill material 206, such as polysilicon and the like, while on the other hand a top surface 261s of the placeholder material 261 may be exposed. Consequently, the resulting surface of the device 200 may be comprised of the interlayer dielectric material 221, the material of the spacer structures 263 and the etch stop liner 223, for instance comprised of silicon nitride, and the fill material 206. As discussed above, the materials 261 and 206 are selected in terms of etch characteristics such that the material 261 may be reliably removed without causing undue erosion of the fill material 206 in the contact openings 222a. In this manner, the sensitive contact regions 251c are reliably protected by the material 206, while also a superior surface topography for performing the replacement gate approach is provided. On the basis of the device configuration as shown in FIG. 2i, an appropriate etch process 208 may be applied, for instance, on the basis of wet chemical etch chemistries, plasma assisted etch recipes or a combination thereof in order to remove the material 261. To this end, well-established wet chemical etch chemistries may be used, wherein appropriate process parameters, such as concentration of various components, process temperature and the like, may be readily determined so as to obtain a high etch rate for the material 261 without causing significant material erosion in the fill material 206. For example, TMAH or other caustic agents may be used wherein appropriate process parameters may be readily determined on the basis of experiments in order to obtain a significantly reduced etch rate for the material 206. In other cases, plasma assisted recipes may be applied which are known to have a significantly higher etch rate in a silicon/germanium material compared to a polysilicon material. Furthermore, as discussed above, the etch resistivity of the fill material 206 may be significantly increased, for instance by incorporating an in situ dopant species, such as boron, which may result in a significantly reduced etch rate compared to undoped or more weakly doped polysilicon material or silicon/germanium material, which may be used as the placeholder material 261. After the removal of the placeholder material 261, any appropriate cleaning recipes may be applied, for instance on the basis of APM or SPM, since, contrary to conventional approaches as discussed earlier, the contact openings 222a are reliably filled with the sacrificial material 206. Consequently, after the removal of the placeholder material 261, superior conditions may be achieved in the resulting gate trenches (not shown) by applying well-established and highly efficient wet chemical cleaning recipes. Thereafter, any appropriate and required materials may be formed in the resulting gate trenches.

Figure 2J:
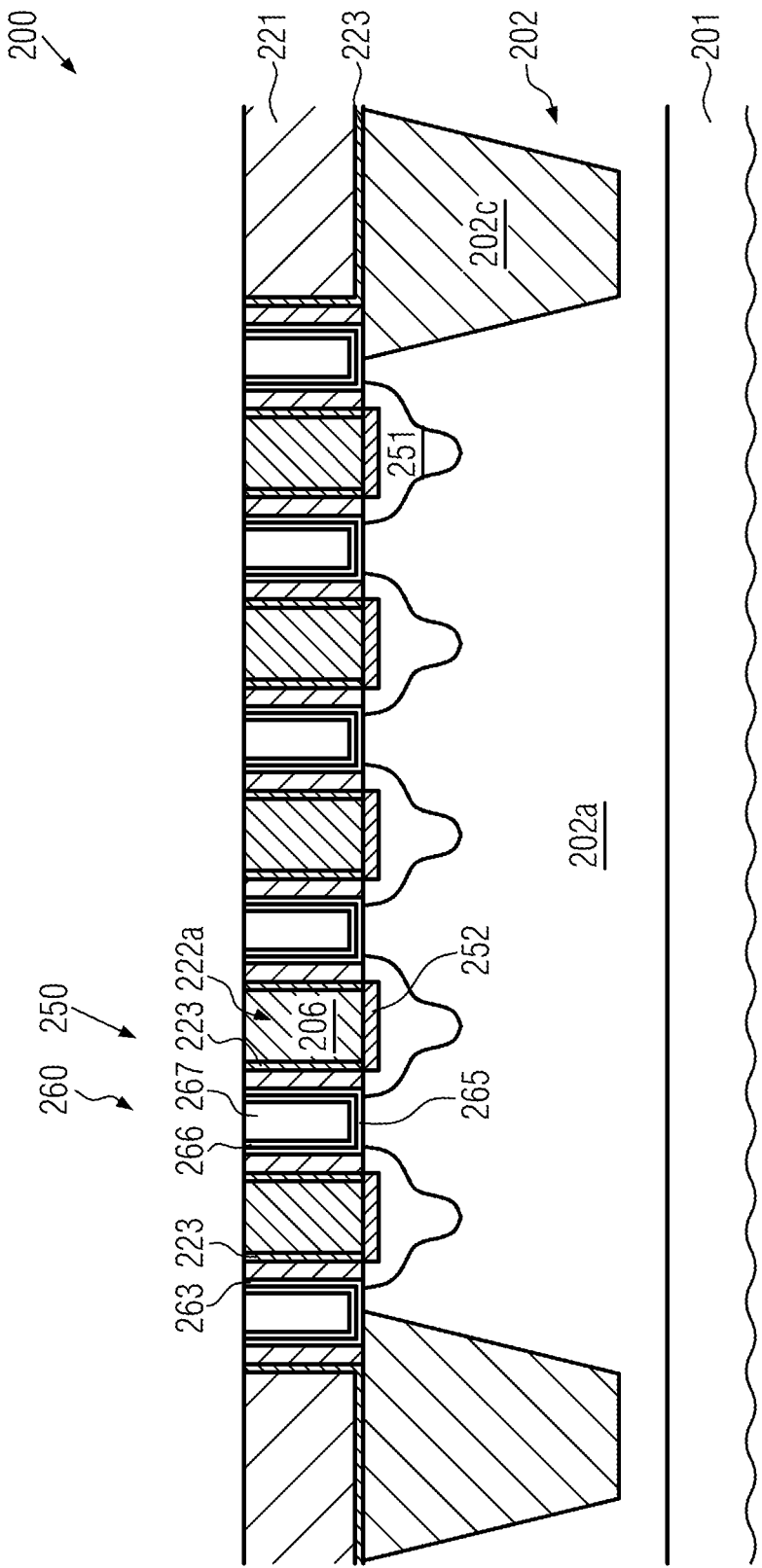

FIG. 2j schematically illustrates the semiconductor device 200 in a further advanced manufacturing stage. As illustrated, the gate electrode structures 260 may now comprise at least a work function metal species 266 in combination with an electrode metal 267, which may be provided in the form of aluminum, an aluminum alloy and the like. The work function species 266 may be provided in the form of a dedicated metal layer, such as aluminum, lanthanum, tantalum, titanium, titanium nitride, tantalum nitride and the like, as is required for obtaining the desired work function and thus threshold voltage of the transistors 250. In some illustrative embodiments, prior to incorporating the work function metal species 266, a gate dielectric layer 265 may be formed, for instance, on the basis of a conventional dielectric material, such as silicon dioxide and the like, in combination with a high-k dielectric material, such as hafnium oxide, zirconium oxide and the like. To this end, a base dielectric material may be formed by chemical oxidation and the like, deposition and the like, followed by a highly conformal deposition of a high-k dielectric material, which may be accomplished by using well-established atomic layer deposition (ALD) techniques and the like. Thereafter, the work function metal species 266 may be deposited which may include the deposition of two or more material layers and the patterning thereof in order to provide an appropriate work function metal species for the different types of transistors to be provided in the semiconductor device 200. Furthermore, if required, additional heat treatments may be performed which may be compatible with any metal silicides formed in the drain and source regions 251. After providing the respective work function metal species for the various transistor types, the fill metal 267 may be deposited on the basis of any well-established deposition technique, followed by a removal process for removing any excess metal and possibly any excess dielectric material. During the corresponding process for incorporating the materials 265, 266, 267 and removing any excess portion thereof, the superior surface topography provided by the fill material 206 may result in superior process robustness and uniformity.

Thereafter, the fill material 206 may be removed selectively with respect to the interlayer dielectric material 221, the spacer structure 263, the etch stop layer 223 and the materials of the gate electrode structures 260. To this end, well-established wet chemical etch recipes or plasma assisted etch recipes may be applied. For example, if a polysilicon material is to be removed, TMAH, potassium hydroxide and the like may be efficiently used as wet chemical etch chemistries, which have a high degree of selectivity with respect to the other materials of the device 200. In other cases, when the etch resistivity of the a material 206 has intentionally been increased with respect to a specific etch recipe, different chemistries or etch parameters may be selected so as to efficiently remove the fill material 206. For example, well-established etch recipes may be applied which are appropriate for removing highly doped polysilicon material. After reopening the contact openings 222a, the further processing may be continued by depositing any appropriate contact material.

Figure 2K:
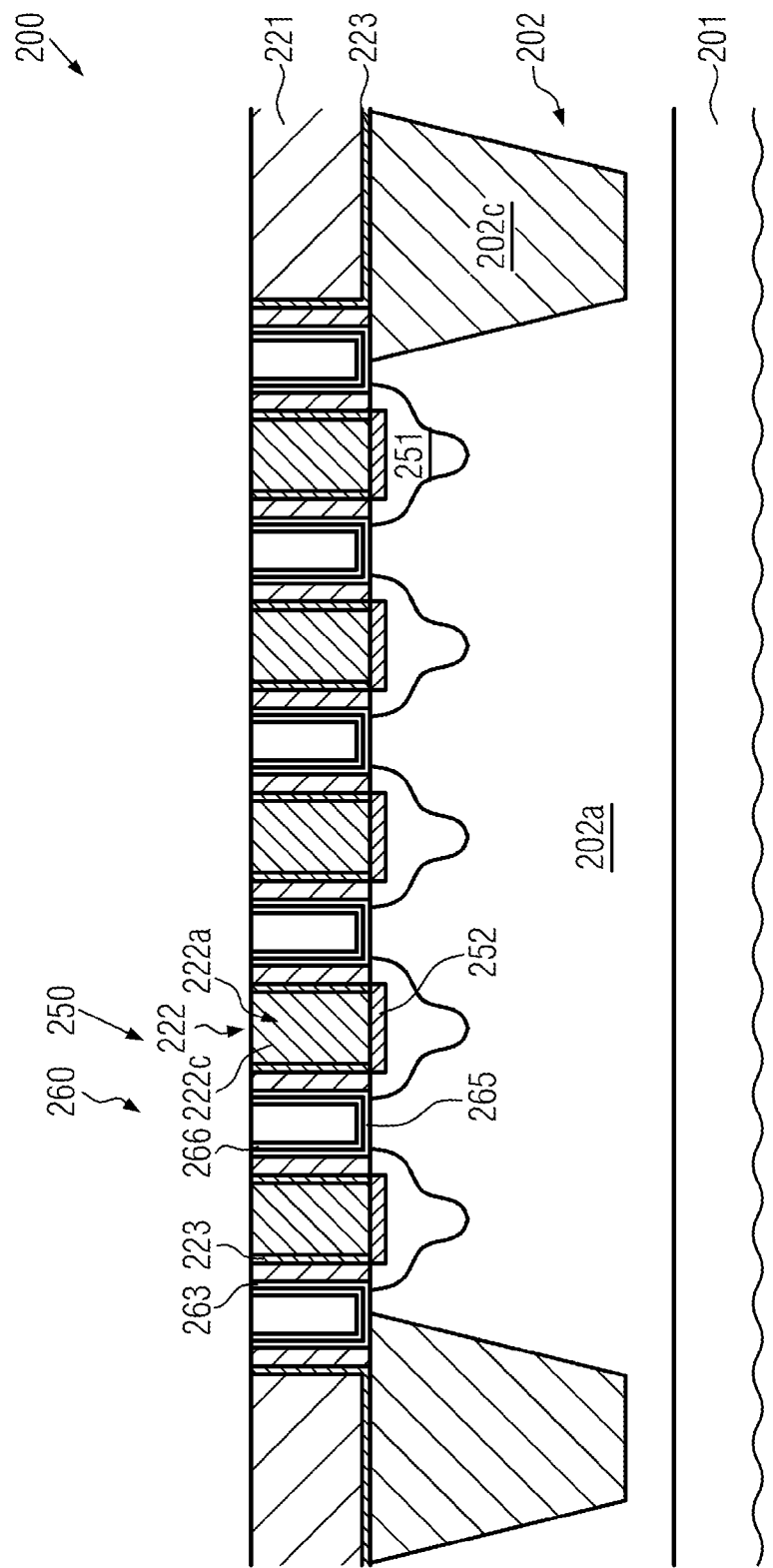

FIG. 2k schematically illustrates the semiconductor device 200 in a further advanced manufacturing stage. As shown, the contact openings 222a are filled with an appropriate contact material 222c in order to form self-aligned contact elements 222. For example, the contact material 222c may be comprised of tungsten, possibly in combination with an appropriate barrier material, such as a bilayer formed of titanium and titanium nitride, while in other cases any other appropriate material, such as titanium nitride, may be provided in the contact openings 222a. To this end, well-established deposition techniques may be applied for providing an appropriate barrier material followed by the actual contact metal. In other illustrative embodiments, the contact material 222c may be provided in the form of an aluminum-containing material, such as substantially pure aluminum, an aluminum alloy and the like, which may be preferable with respect to reducing the overall contact resistivity of the device 200. Typically, highly conductive metals, such as aluminum, aluminum alloys and the like, may have a significantly lesser thermal stability compared to tungsten material which, however, may be compatible with the manufacturing stage of the device 200 since any high temperature processes as are typically required for forming the metal silicide regions 252 and for appropriately adjusting the work function of the various gate electrode structures 260 and/or adjusting the material characteristics of a high-k dielectric material have been completed prior to depositing the contact material 222c. If desired, even highly conductive material such as copper, silver and the like may be efficiently used, possibly in combination with appropriate barrier materials, in order to form the contact elements 222.

The material 222c may be deposited on the basis of any appropriate deposition strategy, such as chemical vapor deposition, physical vapor deposition, electrochemical deposition and the like. Thereafter, any excess material may be efficiently removed by performing a planarization process such as a CMP process. In this manner, the contact elements 222 and the gate electrode structures 260 including highly conductive gate materials may be provided in the form of electrically isolated entities. Thereafter, the further processing may be continued by depositing a further interlayer dielectric material and patterning the same so as to form contacts in order to connect to the gate electrode structures 260 and to the contact elements 222.

As a result, the present disclosure provides manufacturing techniques and semiconductor devices in which self-aligned contact elements may be formed on the basis of a replacement gate approach, wherein the high-k metal gate electrode structure and contact regions may be provided prior to actually depositing the conductive material of the contact elements. The replacement gate approach may be performed on the basis of contact openings that are filled with an appropriate sacrificial fill material that provides superior process robustness during the replacement gate approach. On the other hand, the fill material may be efficiently removed selectively with respect to the high-k metal gate electrode structures, thereby providing superior process uniformity and flexibility.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a gate electrode material layer stack on an active region of a semiconductor device, said gate electrode material layer stack comprising a layer of cap material formed above a layer of placeholder material;
   patterning said gate electrode material stack to form a gate electrode structure on said active region, said gate electrode structure comprising said cap material positioned above said placeholder material;
   forming a spacer structure adjacent to said gate electrode structure, said spacer structure covering sidewalls of said cap material and said placeholder material;
   after forming said sidewall spacer structure, forming an interlayer dielectric material above and adjacent to said active region;
   removing said interlayer dielectric material selectively from above at least a portion of said active region so as to expose a contact region of said active region that is positioned laterally adjacent to said gate electrode structure;
   forming a sacrificial fill material laterally adjacent to and above said gate electrode structure, said sacrificial fill material covering said spacer structure and said contact region;

exposing a surface of said placeholder material by performing a planarization process to planarize said sacrificial fill material and remove said cap material from said gate electrode structure;

replacing said placeholder material with at least an electrode metal in the presence of said sacrificial fill material;

removing said sacrificial fill material so as to re-expose said contact region of said active region after replacing said placeholder material; and forming a conductive material on said exposed contact region so as to form a contact element.

2. The method of claim 1, wherein replacing said placeholder material comprises etching said placeholder material selectively with respect to said sacrificial fill material.

3. The method of claim 2, wherein said placeholder material is formed so as to comprise a semiconductor material.

4. The method of claim 3, wherein forming said sacrificial fill material comprises forming a second semiconductor material.

5. The method of claim 3, wherein said semiconductor material comprises germanium.

6. The method of claim 4, wherein forming said sacrificial fill material comprises incorporating a dopant species so as to adjust an etch behavior of said sacrificial fill material.

7. The method of claim 1, further comprising forming a metal/semiconductor compound in said contact region prior to forming said sacrificial fill material.

8. The method of claim 7, wherein said metal/semiconductor compound is formed after removing said interlayer dielectric material selectively so as to expose said contact region.

9. The method of claim 8, further comprising using said cap material as a protective mask when removing said interlayer dielectric material selectively from above said active region.

10. The method of claim 1, wherein forming said contact element comprises forming an aluminum material above said contact region.

11. A method, comprising:

forming a gate electrode structure on an active region of a semiconductor device, said gate electrode structure comprising a placeholder material and a cap layer formed above said placeholder material, wherein said placeholder material is a first semiconductor material;

forming a sidewall spacer structure adjacent to sidewalls of said cap layer and said placeholder material of said gate electrode structure;

after forming said sidewall spacer structure, forming an interlayer dielectric material above and adjacent to said active region;

removing said interlayer dielectric material selectively from above at least a portion of said active region so as to form contact openings laterally adjacent to said gate electrode structure;

forming a sacrificial fill material in said contact openings, wherein said sacrificial fill material is a second semiconductor material; and replacing said placeholder material of said gate electrode structure at least with a metal-containing electrode material in the presence of said sacrificial fill material.

12. The method of claim 11, wherein replacing said placeholder material comprises planarizing said interlayer dielectric material and a portion of said gate electrode structure so as to expose a top surface of said placeholder material.

13. The method of claim 12, wherein replacing said placeholder material further comprises performing an etch process without masking said sacrificial fill material.

14. The method of claim 11, further comprising forming a metal/semiconductor compound in said active region through said contact openings prior to forming said sacrificial fill material.

15. The method of claim 11, further comprising removing said sacrificial fill material from said contact openings selectively with respect to said metal-containing electrode material and forming a conductive material in said contact openings so as to form contact elements.

16. The method of claim 15, wherein forming said contact element comprises forming an aluminum material in said contact openings.

17. The method of claim 11, wherein said first semiconductor material comprises silicon/germanium.

18. The method of claim 11, wherein said second semiconductor material comprises silicon.

19. The method of claim 11, further comprising forming an etch stop layer at least on said sidewall spacer structure and said cap layer prior to forming said interlayer dielectric material.

20. A method, comprising:

forming a gate electrode structure on an active region of a semiconductor device, said gate electrode structure comprising a semiconductor-containing placeholder material and a cap layer formed above said semiconductor-containing placeholder material;

forming a sidewall spacer adjacent to said gate electrode structure, said sidewall spacer covering sidewalls of said cap layer and said semiconductor-containing placeholder material;

forming an interlayer dielectric material above and adjacent to said active region, said interlayer dielectric material covering said sidewall spacer and contact regions of said active region positioned laterally adjacent to said gate electrode structure;

removing said interlayer dielectric material selectively from above at least a portion of said active region so as to form contact openings laterally adjacent to said gate electrode structure, said contact openings exposing said contact regions;

forming a metal/semiconductor compound in said contact regions through said contact openings;

after forming said metal/semiconductor compound in said contact regions, forming a semiconductor-containing sacrificial fill material in said contact openings; and replacing said placeholder material of said gate electrode structure at least with a metal-containing electrode material in the presence of said sacrificial fill material.

21. A method, comprising:

forming a plurality of gate electrode structures above an active region of a semiconductor device, each of said plurality of gate electrode structures comprising a placeholder material and a cap layer formed above said placeholder material;

forming a spacer structure adjacent to each of said plurality of gate electrode structures, each spacer structure covering sidewalls of said cap layer and said placeholder material of a respective one of said plurality of gate electrode structures;

forming an interlayer dielectric material above said semiconductor device, said interlayer dielectric material completely filling spaces defined between said spacer structures of each adjacent pair of said plurality of gate electrode structures;

selectively removing said interlayer dielectric material from at least a first space defined between sidewall spacers formed adjacent to a first adjacent pair of said plurality of gate electrode structures so as to expose at least a first common contact region between said first adjacent pair;

forming a sacrificial fill material above said semiconductor device, said sacrificial fill material completely re-filling said at least said first space and covering said at least said first common contact region;

exposing a surface of said placeholder material by planarizing said sacrificial fill material;

replacing, in the presence of said sacrificial fill material, said placeholder material of at least said first adjacent pair of said plurality of gate electrode structures with at least an electrode metal;

after replacing said placeholder material, removing said sacrificial fill material from said at least said first space so as to re-expose said at least said first common contact region; and forming a conductive material above said semiconductor device so as to form a first contact element in said at least said first space and on said first common contact region.

22. The method of claim 21, further comprising forming an etch stop liner above said semiconductor device prior to forming said interlayer dielectric material, said etch stop liner covering at least each of said cap layers, each of said spacer structures, and said active region between each adjacent pair of said plurality of gate electrode structures.

* * * * *